United States Patent
Yaung et al.

(10) Patent No.: US 7,061,028 B2
(45) Date of Patent: Jun. 13, 2006

(54) IMAGE SENSOR DEVICE AND METHOD TO FORM IMAGE SENSOR DEVICE

(75) Inventors: Dun-Nian Yaung, Taipei (TW);
Shou-Gwo Wuu, Hsin-Chu (TW);
Ho-Ching Chien, Hsinchu (TW);
Chein-Hsien Tseng, Hsinchu (TW)

(73) Assignee: Taiwan Semiconductor Manufacturing, Co., Ltd., Hsinchu (TW)

( * ) Notice: Subject to any disclaimer, the term of this patent is extended or adjusted under 35 U.S.C. 154(b) by 285 days.

(21) Appl. No.: 10/388,274

(22) Filed: Mar. 12, 2003

(65) Prior Publication Data

US 2004/0180461 A1    Sep. 16, 2004

(51) Int. Cl.
*H01L 29/73* (2006.01)
(52) U.S. Cl. .................. 257/208; 257/435; 257/445; 250/208.1; 250/239
(58) Field of Classification Search ............ 250/208.1, 250/239; 257/208, 435, 445, E31.122

See application file for complete search history.

(56) References Cited

U.S. PATENT DOCUMENTS

| | | | | |
|---|---|---|---|---|
| 4,660,207 | A * | 4/1987 | Svilans .................. | 372/45 |
| 5,298,733 | A * | 3/1994 | Ehmke et al. ........... | 250/208.1 |
| 5,648,874 | A | 7/1997 | Sawaki et al. | |
| 6,001,540 | A | 12/1999 | Huang et al. | |
| 6,020,944 | A | 2/2000 | Hoshi | |
| 6,195,196 | B1 | 2/2001 | Kimura et al. | |
| 6,807,353 | B1 * | 10/2004 | Fleming et al. ......... | 385/132 |
| 6,815,654 | B1 * | 11/2004 | Fujieda et al. ......... | 250/208.1 |

* cited by examiner

*Primary Examiner*—George Fourson
*Assistant Examiner*—Thanh V. Pham
(74) *Attorney, Agent, or Firm*—Thomas, Kayden, Horstemeyer & Risley

(57) ABSTRACT

A new method to form an image sensor device is achieved. The method comprises forming an image sensing array in a substrate comprising a plurality of light detecting diodes with spaces between the diodes. A first dielectric layer is formed overlying the diodes but not the spaces. The first dielectric layer has a first refractive index. A second dielectric layer is formed overlying the spaces but not the diodes. The second dielectric layer has a second refractive index that is larger than the first refractive index. A new image sensor device is disclosed.

7 Claims, 4 Drawing Sheets

IMAGE SENSOR DEVICE AND METHOD TO FORM IMAGE SENSOR DEVICE

BACKGROUND OF THE INVENTION (1) Field of the Invention

The invention relates to solid state image sensors, and, more particularly, to a method to form light guides for an image sensor to eliminate cross talk between pixels.

(2) Description of the Prior Art

Light imaging array devices are used in a wide variety of applications. These devices utilize an array of active, semiconductor devices, such as diodes, to convert images into streams of digital data.

Referring now to FIG. 1, a prior art image sensor device is illustrated in cross section. This device comprises a semiconductor substrate 10 onto which an array of diodes is formed. Each diode comprises, for example, an n-type region 22 in a p-type region 18. Each diode is separated from other diodes in the array by isolation regions 14 to thereby form an array of pixels. The pixels are used to convert incoming light 50 and 54 from a light/image source 46 into electrical signals via the photo-diodes.

Typically, the substrate 10 is protected by a series of dielectric layers 26, 30, and 34. These dielectric layers will transmit the incoming light 50 and 54 to the pixels 58 and 62. Further, these dielectric layers may comprises intermetal dielectric (IMD) layers for the integrated circuit device wherein metal lines 38 and 42 are formed.

Incident light 50 and 54 will strike the surface of the top most dielectric layer 34. This light will then be transmitted through the underlying dielectric layers 30 and 26 down to the underlying pixels. It is a common occurrence for the incident light 50 and 54 to strike the imaging device surface at a variety of angles. For example, part of the light 50 strikes the surface at nearly a perpendicular angle. Another part of the light 54 strikes the surface at a clearly non-perpendicular angle. The light 50 that strikes the surface at a near perpendicular angle is transmitted to the pixel 58 underlying the strike location. This is optimal for image sensing performance. However, light 54 that strikes the surface at a non-perpendicular angle may then be transmitted to a nearby pixel 62 rather than to the pixel 58 directly underlying the strike surface. This effect is called cross talk. During a cross-talk event, light 54 falls on an incorrect pixel diodes 62 rather than the intended pixel diodes 58 due to light scattering. The light scattering problem causes degraded image resolution for black and white sensors or complicated color correction for color sensors.

In some prior art sensor arrays, multiple layers of metal lines 42 and 38 are used to create metal shields. These metal shields are designed to suppress light scattering between adjacent pixels. However, the use of multiple layer, metal lines 38 and 42 requires that the metal lines be isolated, and this limitation causes the pixel size to increase. A light image sensor device with an improved light shield that does not increase the pixel size is a goal of the present invention.

Several prior art inventions relate to imaging arrays. U.S. Pat. No. 6,001,540 to Huang et al describes a CCD-based imaging array. The array forms microlens by a LOCOS process on a polysilicon layer. Light shield structures, comprising a layer of WSi, are formed over CCD structures that surround the photodiodes. U.S. Pat. No. 5,648,874 to Sawaki et al discloses an optical apparatus. The apparatus uses a matrix comprising acryl resin. Light shielding films are formed overlying and underlying the resin. The light shielding films comprise $Cr_2O_3$ or black paint. U.S. Pat. No. 6,195,196 B1 to Kimura et al describes a flat panel display apparatus. U.S. Pat. No. 6,020,944 to Hoshi teaches a LCD apparatus. The apparatus uses a light guide member comprising an anisotropic member with a refractive index anisotropy and a non-anisotropic member with no refractive index anisotropy.

SUMMARY OF THE INVENTION

A principal object of the present invention is to provide an effective and very manufacturable method to fabricate an image sensing array device in the manufacture of an integrated circuit device.

A further object of the present invention is to provide a method to form an image sensing array with light guides for each pixel in the array.

A yet further object of the present invention is to form light guides and light shields for pixels in the array using dielectric materials having differing indexes of refraction.

A yet further object of the present invention is to form light guides and light shields where the total reflection effect is used to prevent cross talk.

Another further object of the present invention is to provide an image sensor array device having improved performance.

In accordance with the objects of this invention, a method to form an image sensor device is achieved. The method comprises forming an image sensing array in a substrate comprising a plurality of light detecting diodes with spaces between the diodes. A first dielectric layer is formed overlying the diodes but not the spaces. The first dielectric layer has a first refractive index. A second dielectric layer is formed overlying the spaces but not the diodes. The second dielectric layer has a second refractive index that is larger than the first refractive index.

Also in accordance with the objects of this invention, an image sensor device is achieved. The device comprises an image sensing array in a substrate comprising a plurality of light detecting diodes with spaces between the diodes. An array of light guides overlies the substrate. The array of light guides comprises a first dielectric layer overlying the spaces and a second dielectric layer overlying the diodes. The refractive index of the second dielectric layer is larger than the refractive index of the first dielectric layer. Light incident on the second dielectric layer overlying any diode is prevented from striking any other diode by the first dielectric layer.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form an image sensor array device. The device uses dielectric layers having differing indexes of refraction to create light guides and light shields for each pixel in the array. This method prevents light cross talk. It should be clear to those experienced in the art that the present invention can be applied and extended without deviating from the scope of the present invention.

Figure 1:
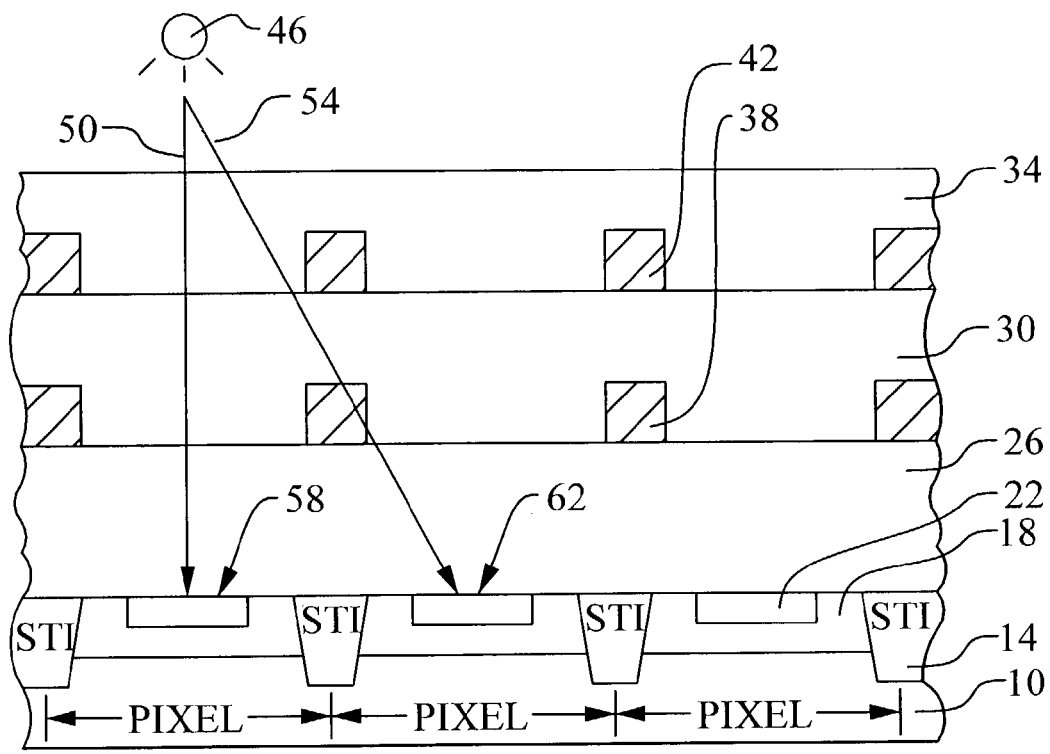
FIG. 1 illustrates a prior art image sensing device, in cross section, showing the problem of light cross talk between adjacent pixels in the image array.
Figure 2:
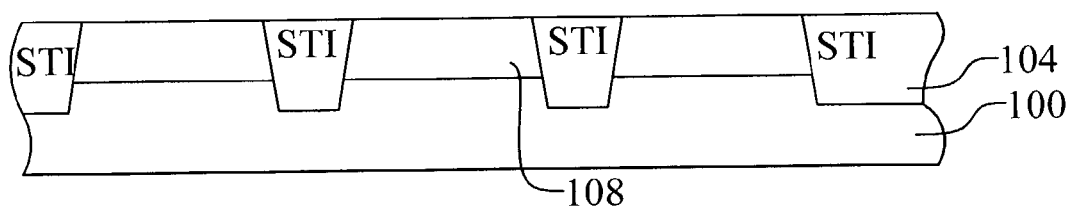
FIGS. 2 through 7 illustrate, in cross section, the preferred embodiment of the present invention.

Referring now to FIG. 2, the preferred embodiment of the present invention is illustrated. Several important features of the present invention are shown therein and discussed below. The embodiments of the present invention are applied to the formation of a unique, image sensor array comprising a plurality of diodes formed in a semiconductor substrate. The teachings may be further applied to any form of image sensing array.

In particular, a substrate 100 is provided. The substrate 100 preferably comprises a semiconductor material and, more preferably, monocrystalline silicon. The substrate 100 is divided into an array of active regions and isolation regions 104. The isolation regions 104 in the array preferably comprise shallow trench isolation (STI) 104 formed using techniques well known in the art. However, any isolation technique may be used between the diode-pixels. Diode wells 108 may be formed in the substrate 104. For example, p-well 108 regions may be formed in the substrate 100 for each planned diode. These wells 108 may be formed using diffusion or ion implantation as is well known in the art.

Figure 3:
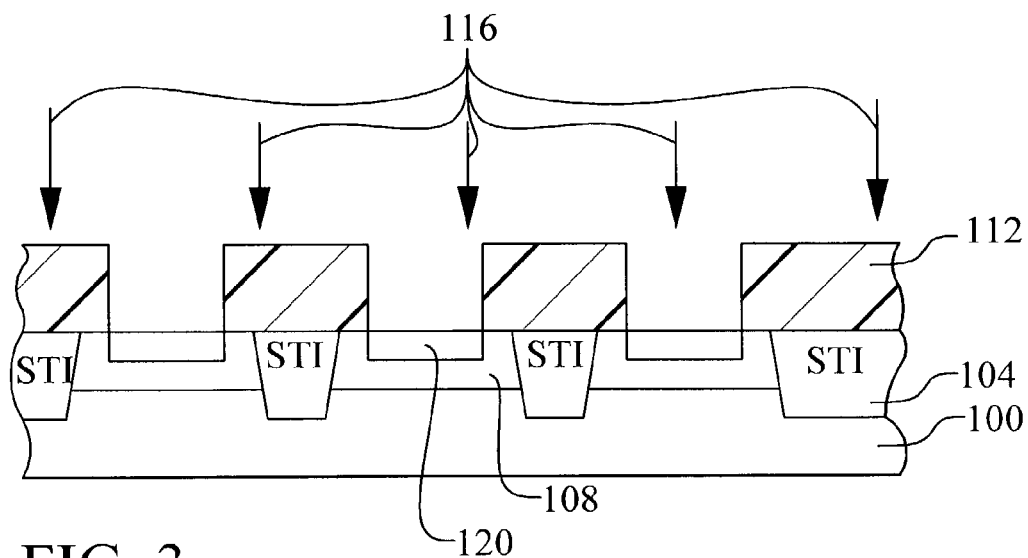

Referring now to FIG. 3, a plurality of diodes 120 and 108 are formed in the substrate 100. For example, a plurality of n-type regions 120 are formed in the substrate 100 such that the n-type regions 120 are contained in the p-well regions 108. These n-type cathodes 120 are preferably formed by selectively implanting ions 116 into the substrate 100. A masking layer 112 is preferably formed overlying the substrate 100. This masking layer 112 may comprise, for example, a photoresist material that is coated overlying the substrate 100. This photoresist material is exposed through actinic light through a mask and developed. After development, the remaining photoresist material forms the masking layer 112 shown. The ion implantation 116 is performed using known methods to achieve an optimal ion concentration and depth. Following the ion implantation step 116, the masking layer 112 is removed by stripping. This implantation 116, plus any anneal or activation treatment, completes the formation of the array of diodes 108 and 120. Note that an isolation region 104 has been formed between each diode. Therefore, the array actually comprises a plurality of diodes with spaces 104 between the diodes.

Figure 4:
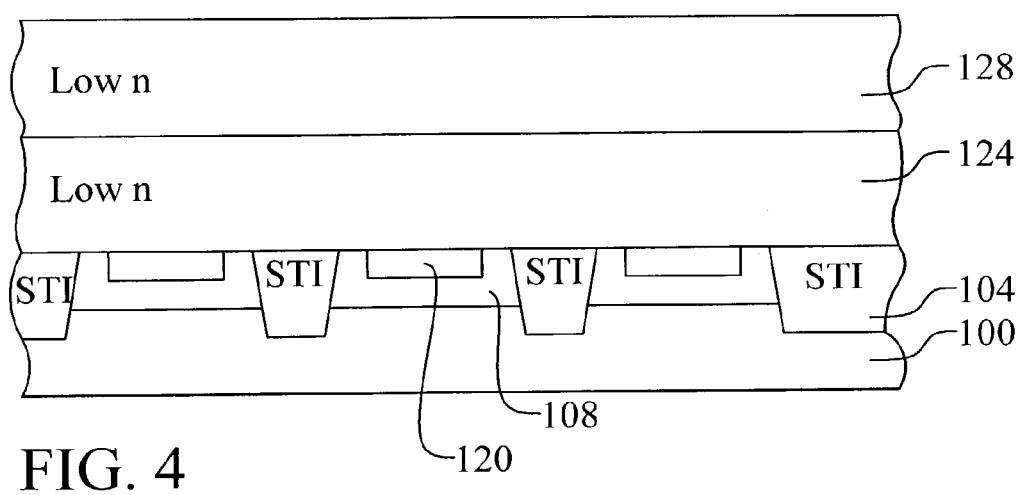

Referring now to FIG. 4, a first dielectric layer 124 and 128 is deposited overlying the diodes 120 and 108 and the spaces 104 between the diodes. This first dielectric layer 124 and 128 may comprise multiple levels of material as shown. More preferably, the first dielectric layer 124 and 128 comprises the intermetal dielectric (IMD) layer used to isolate a plurality of metal levels in the integrated circuit device. For example, if the device is fabricated using a three metal level process, then a separate IMD layer would exist for each of these metal levels. In the case of a first dielectric layer 124 and 128 comprising multiple levels, the various levels 124 and 128 are deposited at different times and may be planarized prior to the deposition of the next level. In addition, the metal levels would be deposited and patterned prior to the formation of the dielectric layer for the subsequent level. These metal levels could be formed using traditional deposition and etch or using damascene techniques.

Of particular importance to the present invention, the first dielectric layer 124 and 128 must comprise a material having a lower refractive index value (n) relative to the refractive index value of a subsequently formed, second dielectric layer, not yet shown. A typical first dielectric layer 124 and 128 material is a doped silicate glass, such as fluorinated silicate glass (FSG). FSG has a low k-value and a relatively low n-value of about 1.3. Further, if the image sensor integrated circuit device is formed in a 0.18 micron process, then the first dielectric layer 124 and 128 should comprise a material that has a low dielectric constant value (k) so that the parasitic capacitance of the metal lines is minimized.

Figure 5:
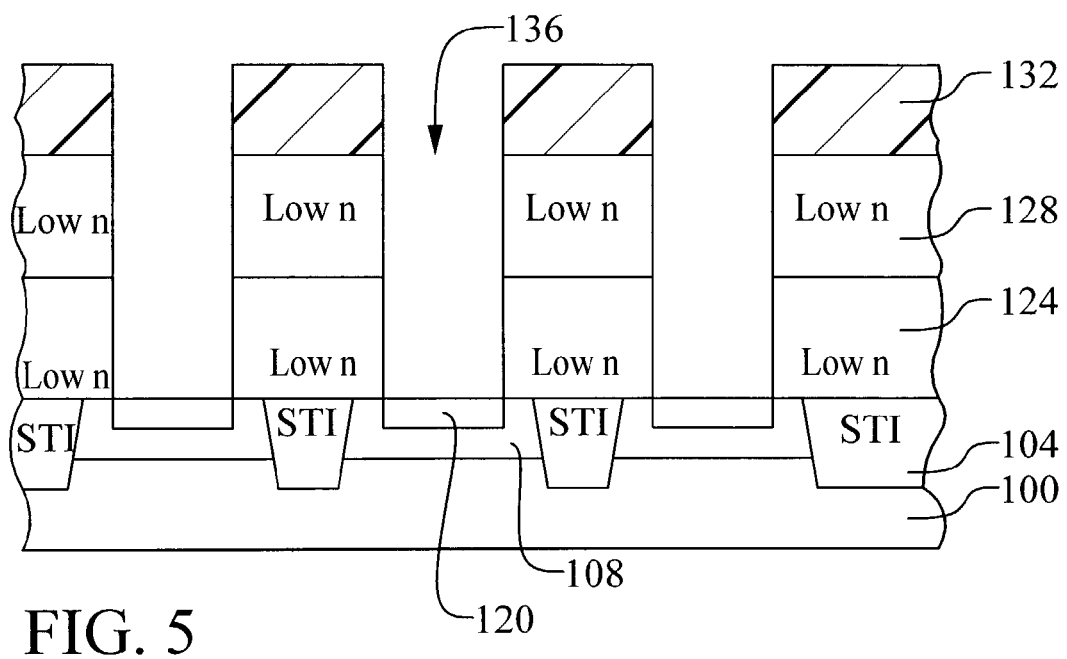

Referring now to FIG. 5, a particularly important feature of the present invention is illustrated. The first dielectric layer 124 and 128 is patterned. This patterning exposes the underlying diodes 120 by removing the first dielectric layer 124 and 128 overlying these diodes 120. In addition, the first dielectric layer 124 and 128 overlying the spaces 104 between the diodes is not removed. A masking layer 132 may be used to facilitate the selective etching process. This masking layer 132 preferably comprises a photoresist material that is patterned using the technique described above in FIG. 3. Further the present masking layer 132 of FIG. 5 is preferably patterned using the same mask that is used for patterning the diode implant masking layer 112 of FIG. 3. After the masking layer 132 is patterned, the first dielectric layer 124 and 128 is selectively etched to generate openings 136 that expose the diodes while leaving the spaces between 104 covered by the remaining first dielectric layer 124 and 128.

Figure 6:
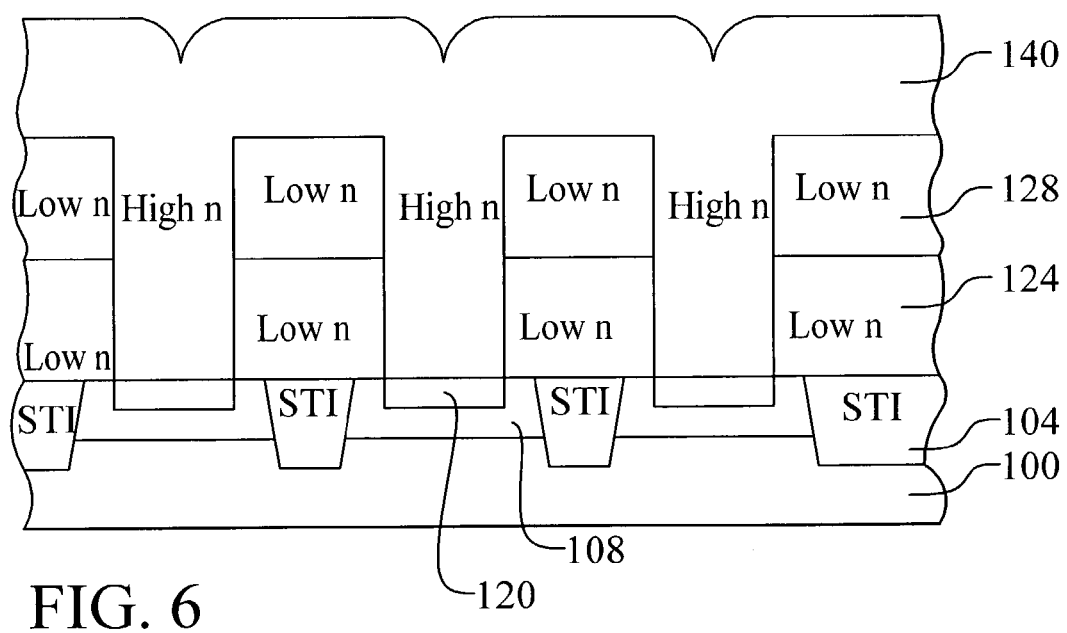

Referring now to FIG. 6, a second dielectric layer 140 is deposited overlying the first dielectric layer 124 and 128, the diodes 120, and filling the openings created in the previous step. The second dielectric layer 140 must comprise a material that will transmit light to the diodes 120. Most importantly, the second dielectric layer 140 must comprise a material having a higher refractive index (n) than the first dielectric layer 124 and 128. For example, the second dielectric layer 140 may comprise a silicon oxide layer deposited using plasma enhanced CVD and a TEOS source. This exemplary material may exhibit a refractive index of about 1.45. This is substantially higher than the refractive index of the exemplary first dielectric layer 124 and 128 comprising FSG that has a value of about 1.3. In general, the refractive index of the second dielectric layer 140 should be larger than the refractive index of the first dielectric layer 124 and 128 by at least 0.1.

Figure 7:
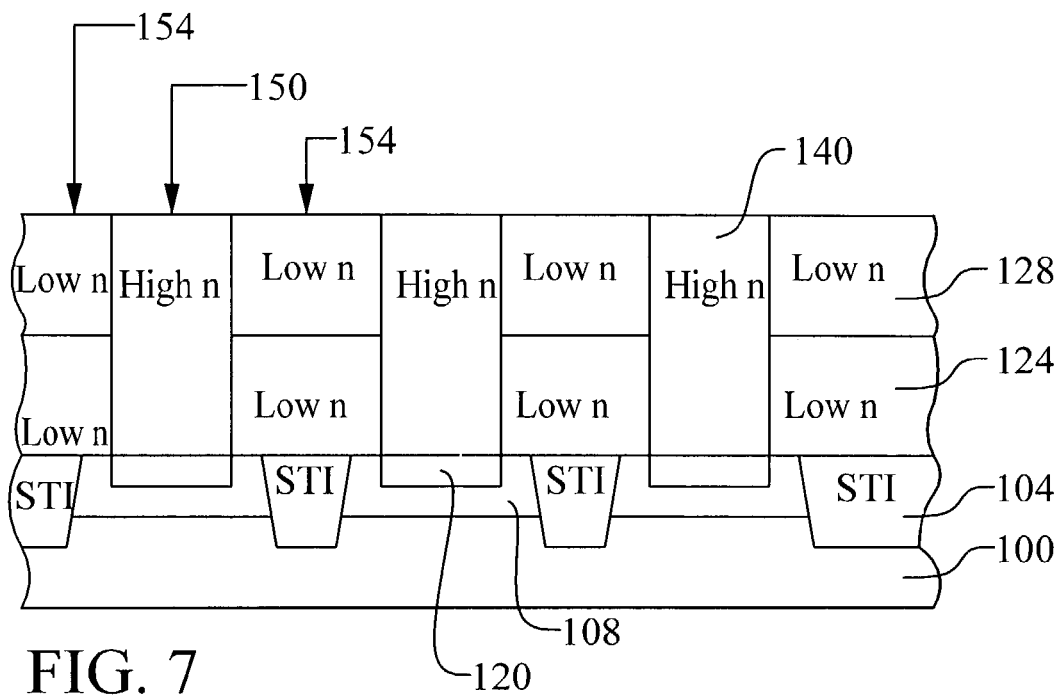

Referring now to FIG. 7, another important feature of the present invention is illustrated. The second dielectric layer 140 is planarized to the top surface of the first dielectric layer 124 and 128. This planarization step may be performed using any planarizing process known in the art. However, the planarizing preferably comprises a chemical mechanical polish (CMP). The planarizing step completes the formation of the unique light guides 150 and light shields 154 of the present invention by removing the second dielectric layer 140 overlying the first dielectric layer 124 and 128.

The unique method of the present invention creates light guides 150 overlying the n-type regions 120 of each of the diodes. These light guides 150 comprise a material with a relatively large refractive index (n). In addition, light shields 154 are formed overlying the spaces 104 between each of the diodes. These light shields comprise material with a lower refractive index (n).

Figure 8:
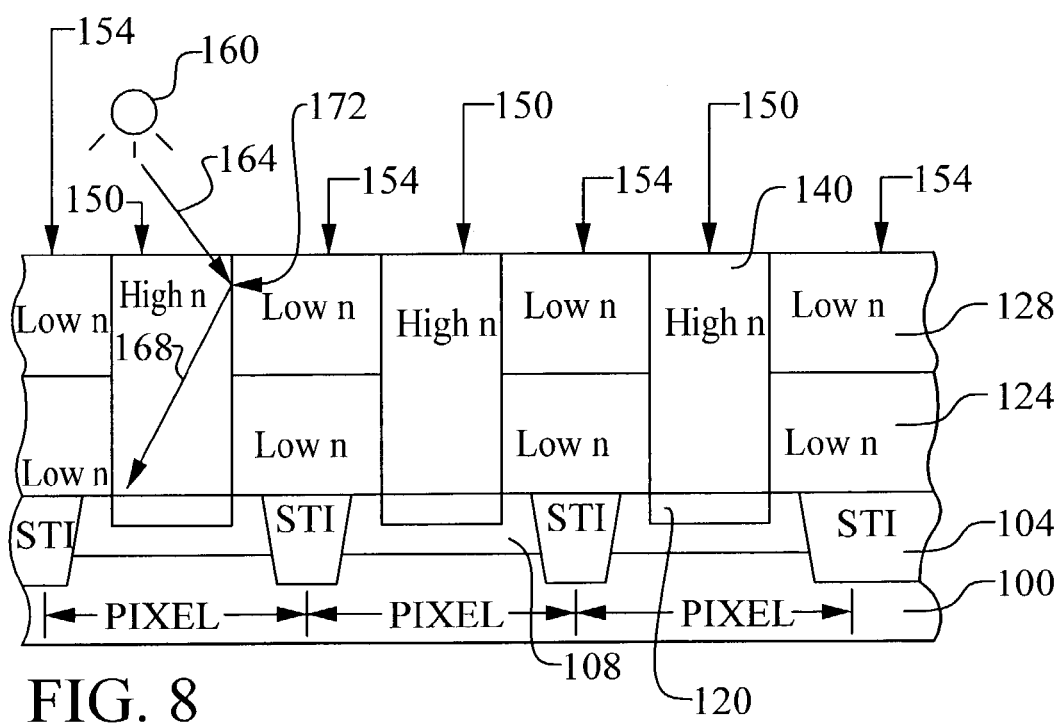
FIG. 8 illustrates the improved performance of the preferred embodiment of the present invention.

Referring now to FIG. 8, the optical performance of the present invention is illustrated. Incident light 164 is emitted from a light source 160. This incident light 164 strikes the light guide 150 above a pixel. Further, this incident light beam 164 strikes the light guide 150 at a non-perpendicular angle and reaches the interface 172 between the light guide 150 and the light shield 154. At this interface 172, the incident light 164 will make a transition between the high refractive index material 140 and the low refractive index material 124 and 128.

As is well known in the art of optics, the transmission of light across such an interface 172 is governed by the equation:

$$n_1 \sin \theta_1 = n_2 \sin \theta_2,$$

where, in this case, $n_1$ is the refractive index of the first dielectric layer 140, $n_2$ is the refractive index of the second dielectric layer 124 and 128, $\theta_2$ is the incident angle of the light 164 striking the interface 172, and $\theta_1$ is the angle of light transmitted into the first dielectric layer 124 and 128. Further, if the incident light 164 does not strike the interface 172 at a 90 degree angle, then a part of the light will be reflected back into the second dielectric layer 140. In the present invention case, however, it is not possible for the incident light 164 to strike the interface 172 at a 90-degree angle. Therefore, there must be a reflected light component 168.

A significant feature of the present invention is the fact that the refractive index of the second dielectric layer ($n_2$) is larger than the refractive index of the first dielectric layer ($n_1$). Therefore, there exists an incident critical angle, $\theta_c$, where all of the incident light 164 will be reflected back into the light guide material 140 and none of the light will be transmitted into the first dielectric layer 124 and 128. This critical angle, $\theta_c$, may be found by setting the transmitted light angle to 90 degrees and results in the equation:

$$\sin \theta_c = n_1/n_2.$$

Based on the refractive indexes of the materials of the preferred embodiment of the present invention, the incident light 164 would be totally reflected back into the second dielectric 140 if the incident angle $\theta_2$, with respect to the perpendicular of the interface 172 surface, exceeds about 61 degrees. As a result, the reflected light 168 strikes the pixel diode 120 underlying the incident light guide 150. The light shield 154 effectively prevents incident light from reaching adjacent pixels due to cross talk. As a result, the unique construction of the present invention results in an image sensor device where the light cross talk effect is dramatically reduced.

The advantages of the present invention may now be summarized. An effective and very manufacturable method to fabricate an image sensing array device in the manufacture of an integrated circuit device is achieved. An image sensing array is formed having light guides for each pixel in the array. Light guides and light shields for pixels in the array are formed using dielectric materials having differing indexes of refraction. These light guides and light shields cause total reflection of incident light within the light guides to thereby prevent cross talk.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. An image sensor device comprising:
   an image sensing array in a substrate comprising a plurality of light detecting diodes with spaces between said diodes; and
   an array of light guides overlying said substrate wherein said array of light guides comprises a column of first dielectric layer vertically aligned with and overlying said spaces and a column of second dielectric layer vertically aligned with and overlying said diodes, wherein the refractive index of said second dielectric layer is larger than the refractive index of said first dielectric layer, and wherein light incident on said second dielectric layer overlying any said diode is prevented from striking any other said diode by said first dielectric layer.

2. The device according to claim 1 wherein said diodes comprise n-type regions in p-type regions.

3. The device according to claim 1 wherein said second refractive index is larger than said first refractive index by at least 0.1.

4. The device according to claim 1 wherein said second dielectric layer is planarized to the top surface of said first dielectric layer.

5. The device according to claim 4 wherein said second dielectric layer is planarized to the top surface of said first dielectric layer using a chemical mechanical polish.

6. The device according to claim 1 wherein said first dielectric layer is patterned using the same photolithographic mask that is used for defining ion implantation areas for said diodes.

7. The device according to claim 1 wherein said first dielectric layer comprises multiple levels.

* * * * *